(12) United States Patent
Fujioka (10) Patent No.: US 11,120,851 B1
(45) Date of Patent: Sep. 14, 2021

(54) MEMORY APPARATUS AND BURST READ AND BURST WRITE METHOD THEREOF

(71) Applicant: Winbond Electronics Corp., Taichung (TW)

(72) Inventor: Shinya Fujioka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/926,773

(22) Filed: Jul. 12, 2020

(51) Int. Cl.
*G11C 7/00* (2006.01)
*G11C 7/10* (2006.01)
*G11C 7/22* (2006.01)

(52) U.S. Cl.
CPC ............ *G11C 7/1039* (2013.01); *G11C 7/106* (2013.01); *G11C 7/1087* (2013.01); *G11C 7/22* (2013.01)

(58) Field of Classification Search
CPC .................................................... G11C 7/1039
USPC ......................................................... 365/222
See application file for complete search history.

(56) References Cited

U.S. PATENT DOCUMENTS

| 8,634,241 | B2 | 1/2014 | Lee et al. |
| 10,404,674 | B1 | 9/2019 | Bshara et al. |
| 2004/0218435 | A1* | 11/2004 | Takahashi ............. G11C 11/408 365/200 |
| 2005/0078506 | A1 | 4/2005 | Rao et al. |
| 2011/0007593 | A1* | 1/2011 | Takano ................. G11C 11/406 365/222 |

FOREIGN PATENT DOCUMENTS

| CN | 104487943 | 4/2015 |
| CN | 107305781 | 10/2017 |
| TW | 200845037 | 11/2008 |
| TW | I671757 | 9/2019 |

OTHER PUBLICATIONS

"Office Action of Taiwan Counterpart Application", dated Jan. 12, 2021, p. 1-p. 6.

* cited by examiner

*Primary Examiner* — Hoai V Ho
(74) *Attorney, Agent, or Firm* — JCIPRNET (57) ABSTRACT

A memory apparatus includes a pseudo static random access memory and a controller. The controller is configured to provide an external command to the pseudo static random access memory. When the memory apparatus starts a burst read operation or a burst write operation, the controller provides a plurality of page starting addresses to the pseudo static random access memory, and the pseudo static random access memory sequentially performs the burst read operation or the burst write operation according to a sequence of receiving the page starting addresses.

14 Claims, 5 Drawing Sheets

FIG. 6 ns and a burst read and burst

MEMORY APPARATUS AND BURST READ AND BURST WRITE METHOD THEREOF

BACKGROUND

Technical Field

The disclosure relates to a memory, and particularly relates to a memory apparatus and a burst read and burst write method thereof.

Description of Related Art

Recently, narrowband Internet of things (NB-IOT), wearable devices, and mobile displays are in demand for low pin count memories with high-speed access throughput. However, the existing low pin count memories (e.g., HyperRAM) do not support high-speed access throughput. By contrast, a synchronous dynamic random-access memory (SDRAM) supports the high-speed access throughput in a page mode and a bank-interleave mode.

Conventionally, a micro controller unit (MCU) issues a read transaction and a write transaction to a pseudo static random access memory. Regarding the read transaction, read data are output on a DQ bus after a latency period defined in a register space. Regarding the write transaction, after the latency period, written data are transmitted to the pseudo static random access memory.

However, a read address and a write address cannot be updated according to the conventional technology in case of not entering a standby mode. This is because the DQ bus is occupied by a data signal once a read or write operation is started. Accordingly, other addresses and commands cannot be input to the pseudo static random access memory, which may result in low data transmission efficiency and access throughput.

SUMMARY

The disclosure is directed to a memory apparatus and a burst read and burst write method thereof for providing a plurality of page starting addresses at a time of starting a burst read operation or a burst write operation without entering a standby mode, so as to improve burst access efficiency.

An embodiment of the disclosure provides a memory apparatus including a pseudo static random access memory and a controller. The controller is coupled to the pseudo static random access memory. When the memory apparatus starts a burst read operation or a burst write operation, the controller provides a plurality of page starting addresses to the pseudo static random access memory, and the pseudo static random access memory performs the burst read operation or the burst write operation according to a sequence of receiving the page starting addresses.

An embodiment of the disclosure provides a burst read and burst write method, which is adapted to a memory apparatus including a pseudo static random access memory and a controller. The burst read and burst write method includes following steps. A plurality of page starting addresses are provided to the pseudo static random access memory when a burst read operation or a burst write operation is started, and the burst read operation or the burst write operation is performed according to a sequence of receiving the page starting addresses.

According to the above description, in the memory apparatus and the burst read and burst write method thereof provided in one or more embodiments of the disclosure, when the burst read operation or the burst write operation is started, since a plurality of the page starting addresses are provided to the pseudo static random access memory, it is not necessary for the pseudo static random access memory to enter a standby mode in a burst read command cycle or a burst write command cycle, while entry into the standby mode is conventionally required. Therefore, a data occupancy rate of the DQ bus and the burst access efficiency may be improved.

In order to make the above features of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
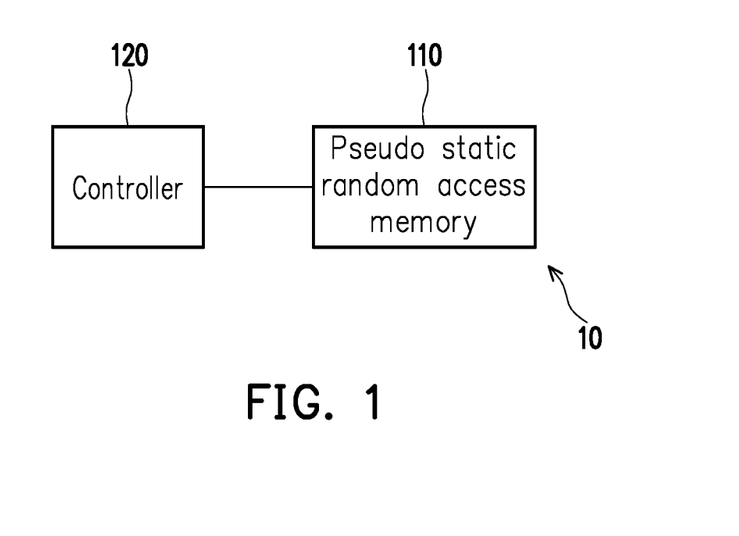
FIG. 1 is a schematic diagram of a memory apparatus according to an embodiment of the disclosure.

With reference to FIG. 1, a memory apparatus 10 may include a pseudo static random access memory 110 and a controller 120. The controller 120 is coupled to the pseudo static random access memory 110. The memory apparatus 10 is, for example, a flash memory or other memories.

In an embodiment, the pseudo static random access memory 110 is composed of a dynamic random access memory (DRAM) serving as a core and a static random access memory (SRAM) serving as an interface.

According to a design requirement, the controller 120 is, for example, a central processing unit (CPU), or other similar devices or a combination of the above devices.

In an embodiment, when the memory apparatus 10 starts a burst read operation or a burst write operation, the controller 120 may provide a plurality of page starting addresses to the pseudo static random access memory 110. The pseudo static random access memory 110 receives the page starting addresses, and the pseudo static random access memory 110 performs the burst read operation or the burst write operation according to a sequence of receiving the page starting addresses. To be specific, the page starting addresses are configured to read or write starting addresses of page continuous addresses of a memory array in the pseudo static random access memory 110. The burst read operation is configured to continuously read a burst address range in the memory according to the page starting address, and the burst write operation is configured to continuously write the write data to the burst address range in the memory according to the page starting address.

For example, when the memory apparatus 10 starts the burst read operation or the burst write operation, the controller 120 may provide page starting addresses A0-AN to the pseudo static random access memory 110. The pseudo static random access memory 110 sequentially receives the page starting addresses A0-AN, and the pseudo static random access memory 110 performs the burst read operation or the burst write operation according to a sequence of receiving the page starting addresses A0-AN. The burst read operation or the burst write operation is first performed to the page starting address A0, and then the burst read operation or the burst write operation is performed to the page starting address A1, and so on, until the burst read operation or the burst write operation is performed to the page starting address AN. N is determined by a design requirement.

Figure 2:
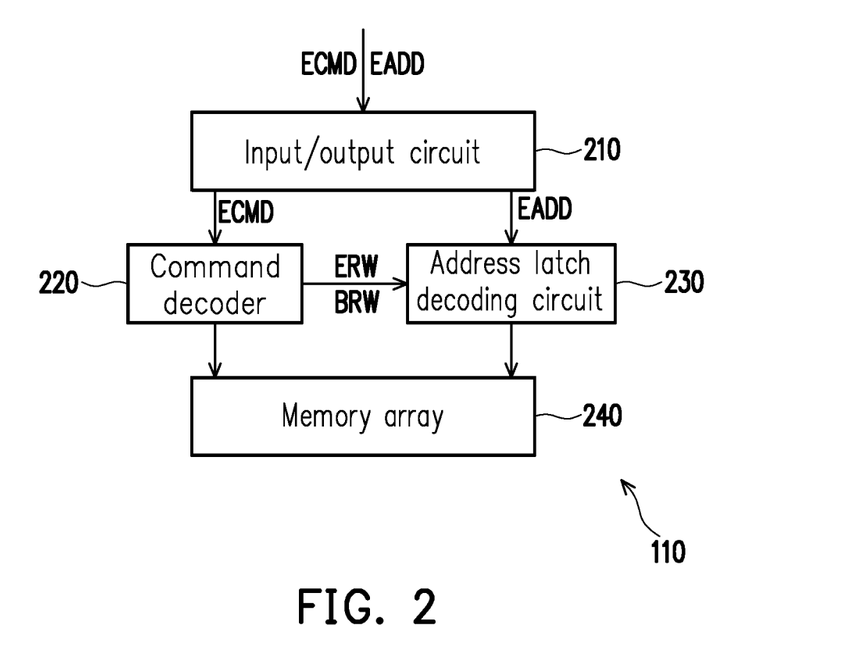
FIG. 2 is a circuit block diagram of a pseudo static random access memory according to an embodiment of the disclosure.

With reference to FIG. 2, the pseudo static random access memory 110 includes an input/output circuit 210, a command decoder 220, an address latch decoding circuit 230 and a memory array 240. In an embodiment, the pseudo static random access memory 110 may further includes other circuits, for example, a data path circuit.

The input/output circuit 210 may be a conventional input/output circuit or other interface circuits, in an embodiment, the input/output circuit 210 is coupled to the controller 120, and the input/output circuit 210 is configured to receive an external command ECMD and an external address EADD from the controller 120, and provide the external command ECMD to the command decoder 220, and provide the external address EADD to the address latch decoding circuit 230. The external address EADD includes the page starting addresses A0-AN.

The command decoder 220 is coupled to the input/output circuit 210. The command decoder 220 is configured to receive the external command ECMD and decode the external command ECMD to provide an external read-write signal ERW and a burst read-write signal BRW to the address latch decoding circuit 230. In an embodiment, the command decoder 220 may be a conventional command decoder or other decoding circuits.

The address latch decoding circuit 230 is coupled to the input/output circuit 210 and the command decoder 220. The address latch decoding circuit 230 is configured to receive the external address EADD from the input/output circuit 210 and receive the external read-write signal ERW and the burst read-write signal BRW from the command decoder 220, and sequentially latch the page starting addresses A0-AN in the external address EADD according to the external read-write signal ERW and the burst read-write signal BRW to provide a burst address BADD to the memory array 240, and sequentially perform the burst read operation or the burst write operation to the memory array 240 according to the page starting addresses A0-AN in the burst address BADD, where N is determined by a design requirement.

The memory array 240 is coupled to the command decoder 220 and the address latch decoding circuit 230. The memory array 240 receives the burst address BADD, and sequentially performs the burst read operation or the burst write operation according to the page starting addresses A0-AN in the burst address BADD. In an embodiment, the memory array 240 may include a conventional sensing amplifier, an X decoder, a Y decoder, and a memory cell array, but the disclosure is not limited thereto.

Figure 3:
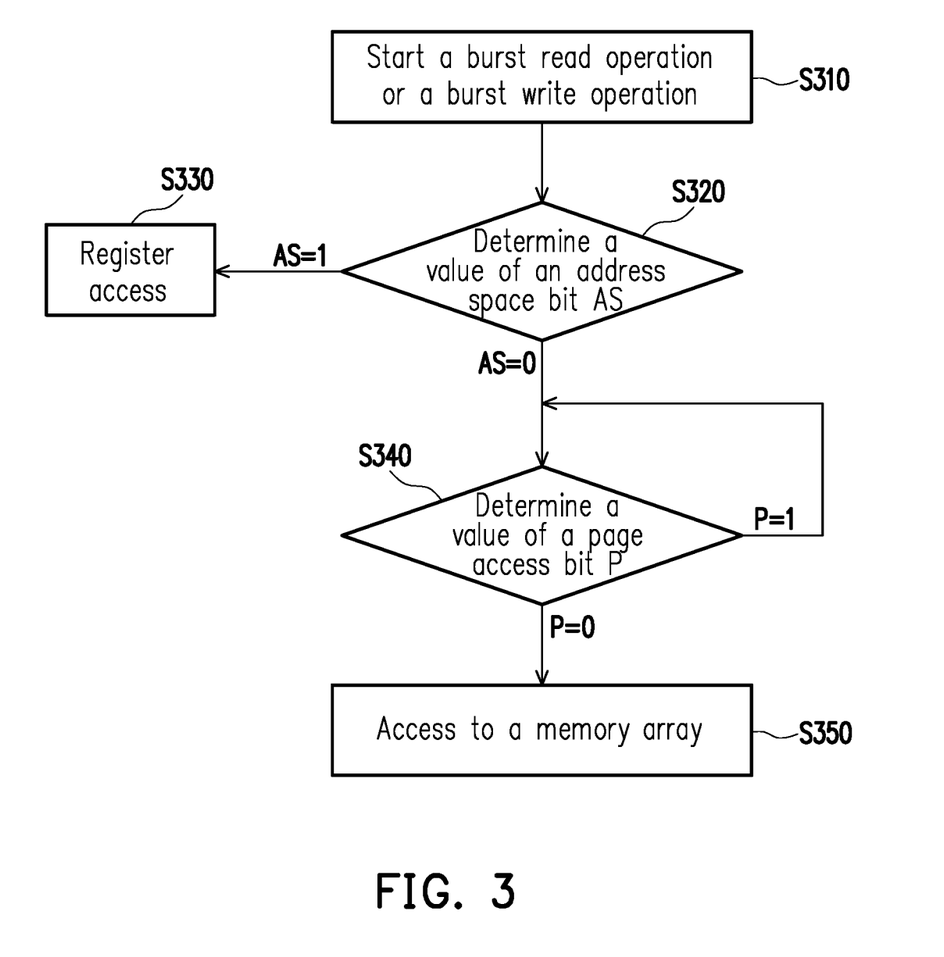
FIG. 3 is a flowchart of determining command bits according to an embodiment of the disclosure.

With reference to FIG. 1, FIG. 2 and FIG. 3, the controller 120 is further configured to provide the external command ECMD to the pseudo static random access memory 110. The external command ECMD includes a command address CA, and the command address CA includes an address space bit AS and a page access bit P. In an embodiment, the command address CA may also include a read or write bit, a burst type bit, etc., which is not limited by the disclosure.

With reference to FIG. 3, in step S310, the memory apparatus 10 starts a burst read operation or a burst write operation. Then, in step S320, the memory apparatus 10 determines whether the burst read operation or the burst write operation is a register access or an access to the memory array according to a value of the address space bit AS in the command address CA. When the value of the address space bit AS is 1, step S330 is executed. When the value of the address space bit AS is 0, step S340 is executed. In the step S330, the pseudo static random access memory 110 performs the register access, and the register access is to access a register (not shown) in the memory apparatus 10. In the step S340, the pseudo static random access memory 110 further determines whether the access to the memory array is a page access according to the page access bit P in the command address CA. When a value of the page access bit P is 1, the pseudo static random access memory 110 receives a next page starting address A1 after receiving the page access address A0, and executes the step S340 again. The above operation is repeated to obtain the required page addresses, and when the last received page address AN is received, the value of the page access bit P is set to 0. When the value of the page access bit P is 0, step S350 is executed. Then, in the step S350, the pseudo static random access memory 110 performs the access to the memory array, where the access to the memory array is to access the memory array 240 in the pseudo static random access memory 110.

In other words, when the memory apparatus 10 starts a burst read operation or a burst write operation, the memory apparatus 10 determines whether to perform the burst read operation or the burst write operation in the memory array of the pseudo static random access memory 110 according to the value of the address space bit AS and the value of the page access bit P.

Figure 5:
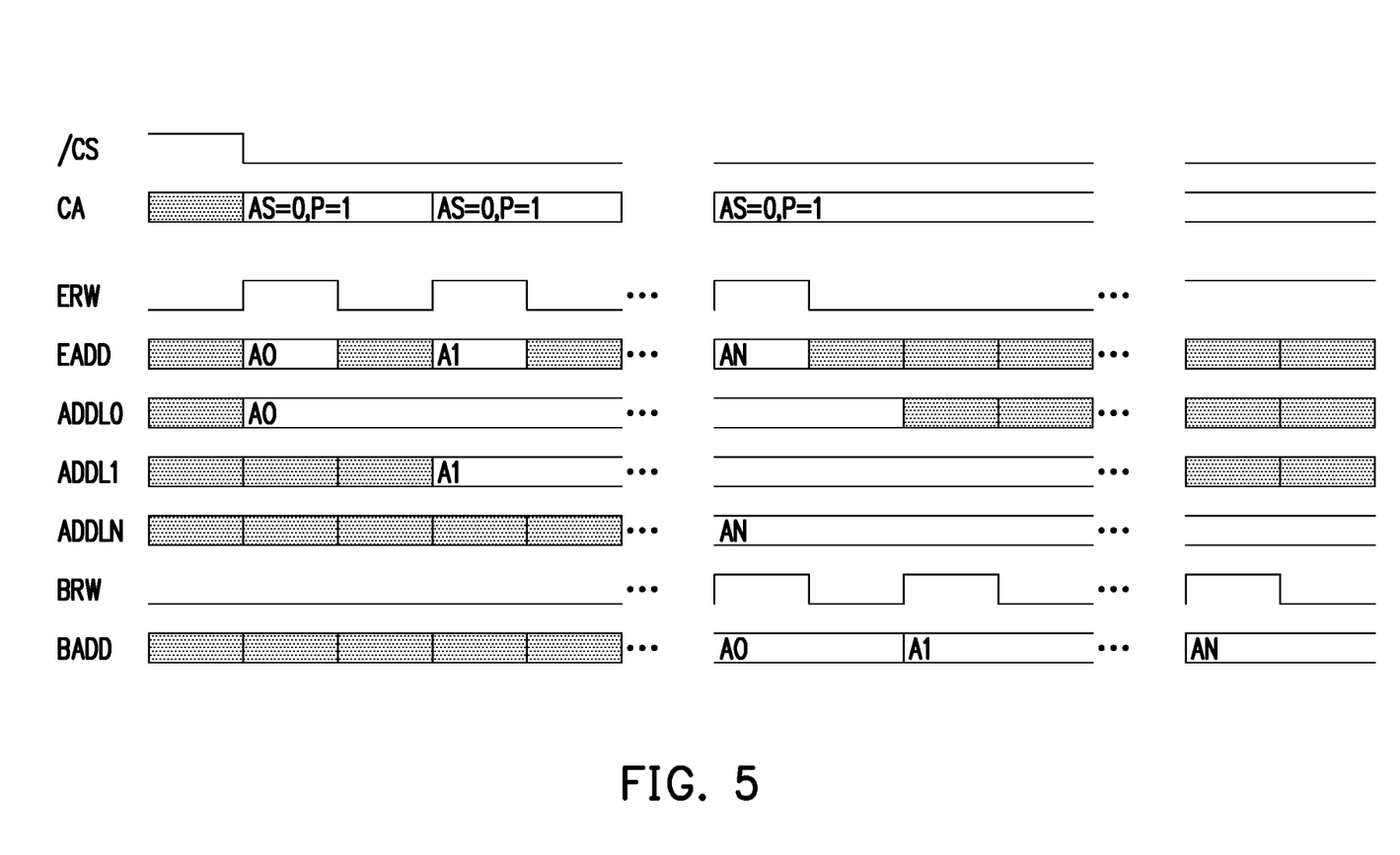
FIG. 5 is a timing diagram of a page access sequence according to an embodiment of the disclosure.

When it is determined that the burst read operation or the burst write operation is the access to the memory array according to the value of the address space bit AS in the command address CA (i.e., AS in the command address CA of FIG. 5 is equal to 0), and it is determined that the access to the memory array is a page access according to the value of the page access bit P in the command address CA (i.e., P in the command address CA of FIG. 5 is equal to 1), the pseudo static random access memory 110 sequentially performs the burst read operation or the burst write operation according to the page starting addresses A0-AN.

When it is determined that the burst read operation or the burst write operation is the register access according to the value of the address space bit AS in the command address CA, i.e., the address space bit AS=1, the pseudo static random access memory 110 performs the register access. When it is determined that the burst read operation or the burst write operation is the access to the memory array according to the value of the address space bit AS in the command address CA, i.e., the address space bit AS=0, the pseudo static random access memory 110 determines whether the access to the memory array is a page access according to the page access bit P in the command address CA. When it is determined that the access to the memory array is the page access according to the value of the page access bit P in the command address CA, i.e., the page access bit P=1, the pseudo static random access memory 110 sequentially receives the page starting addresses A0-AN. When the pseudo static random access memory 110 receives the page starting address AN, the page access bit P=0, and the pseudo static random access memory 110 performs the access to the memory array.

Figure 4:
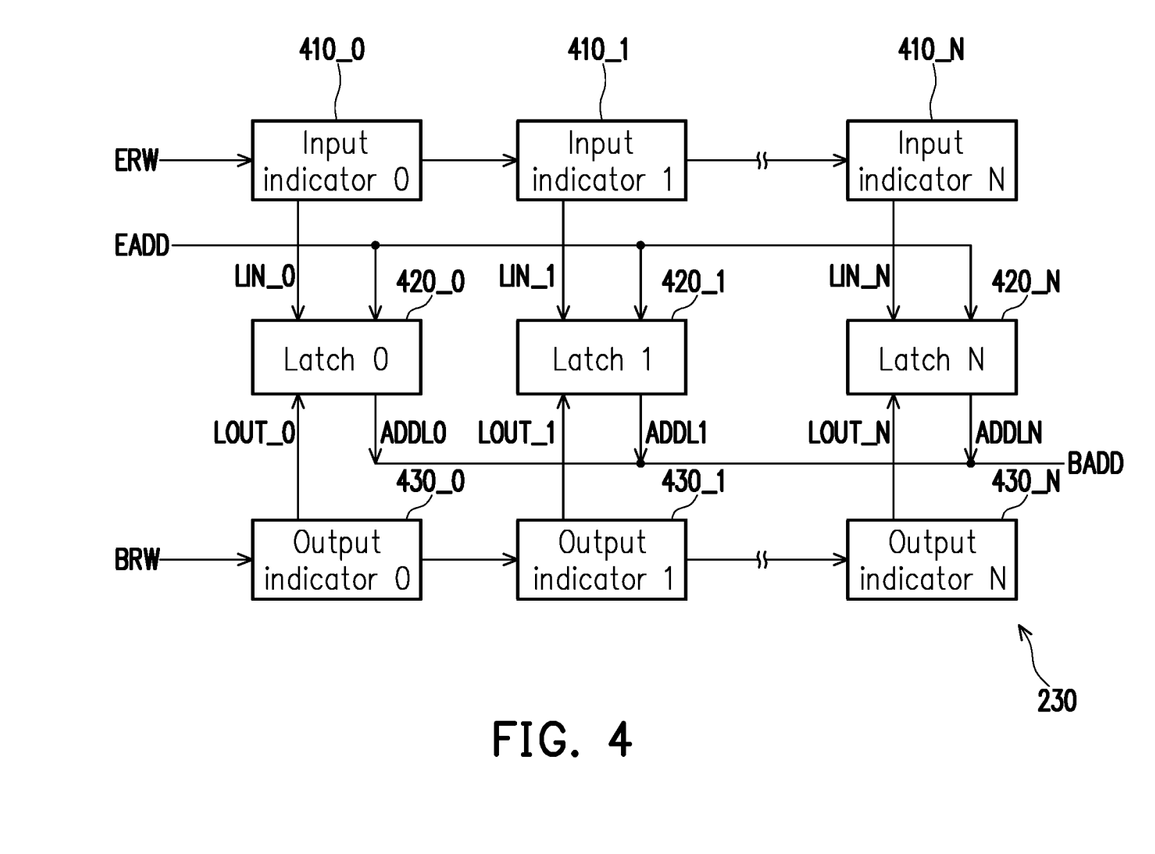
FIG. 4 is a circuit block diagram of an address latch decoding circuit according to an embodiment of the disclosure.

With reference to FIG. 4, the address latch decoding circuit 230 includes input indicators 410_0-410_N, latches 420_0-420_N, and output indicators 430_0-430_N.

The input indicators 410_0-410_N are coupled in series. To be specific, the input indicator 410_1 is coupled to the input indicator 410_0, and so on, until it is coupled to the input indicator 410_N. The input indicator 410_0 receives the external read-write signal ERW from the command decoder 220.

The latches 420_0-420_N are respectively coupled to the input indicators 410_0-410_N. To be specific, the latch 420_0 is coupled to the input indicator 410_0, the latch 420_1 is coupled to the input indicator 410_1, and so on, and the latch 420_N is coupled to the input indicator 410_N. The latches 420_0-420_N receive the external address EADD from the input/output circuit 210, where the external address EADD includes the page starting addresses A0-AN.

The output indicators 430_0-430_N are coupled in series. To be specific, the output indicator 430_1 is coupled to the output indicator 430_0, and so on, until it is coupled to the output indicator 430_N. The output indicators 430_0-430_N are respectively coupled to the latches 420_0-420_N, where the output indicator 430_0 is coupled to the latch 420_0, the output indicator 430_1 is coupled to the latch 420_1, and so on, and the output indicator 430_N is coupled to the latch 420_N. The output indicators 430_0-430_N receive the burst read-write signal BRW from the command decoder 220.

In an embodiment, the input indicators 410_0-410_N generate latch input control signals LIN_0-LIN N according to the external read-write signal ERW, and the latch input control signals LIN_0-LIN N are configured to sequentially latch the page starting addresses A0-AN in the external address EADD to the latches 420_0-420_N. The output indicators 430_0-430_N generate latch output control signals LOUT_0-LOUT N according to the burst read-write signal BRW, and the latch output control signals LOUT_0-LOUT N are configured to enable the latches 420_0-420_N to sequentially output the latched page starting addresses A0-AN in the external address EADD as a latched address ADDL0, a latched address ADDL1, . . . , and a latched address ADDLN, and output the same as the burst address BADD to sequentially output the page starting addresses A0-AN to the memory array 240.

In an embodiment, the latches 420_0-420_N are configured to latch the external address EADD to output the burst address BADD according to the latch input control signals LIN_0-LIN N and the latch output control signals LOUT_0-LOUT N, where the burst address BDD is configured to sequentially and continuously provide the page starting addresses A0-AN in the external address EADD to the memory array 240 to implement the burst read operation or the burst write operation.

In detail, With reference to FIG. 4 and FIG. 5, a chip selection signal /CS is configured to select a chip to be read and written. In the embodiment, when the chip selection signal /CS is transited to a low logic level, the memory apparatus 10 starts to perform the burst read operation or the burst write operation on the chip selected by the chip selection signal /CS. When the burst read operation or the burst write operation is started, it is determined whether to perform the burst read operation or the burst write operation in the memory array 240 of the pseudo static random access memory 110 according to the value of the address space bit AS and the value of the page access bit P in the command address CA. When the address space bit AS is 0 and the page access bit P is 1, the pseudo static random access memory 110 receives the page starting addresses A0-AN in the external address EADD. The input indicators 410_0-410_N generate the latch input control signals LIN_0-LIN N according to the external read-write signal ERW, and the latch input control signals LIN_0-LIN N are configured to sequentially latch the page starting addresses A0-AN in the external address EADD to the latches 420_0-420_N. The output indicators 430_0-430_N generate the latch output control signals LOUT_0-LOUT N according to the burst read-write signal BRW, and the latch output control signals LOUT_0-LOUT N are configured to enable the latches 420_0-420_N to respectively output the latched page starting addresses A0-AN in the external address EADD as the latched address ADDL0, the latched address ADDL1, and the latched address ADDLN, and output the latched address ADDL0, the latched address ADDL1, . . . , and the latched address ADDLN as the burst address BADD to sequentially output the page starting addresses A0-AN to the memory array 240. The burst address BADD sequentially and continuously provides the page starting addresses A0~AN in the external address EADD to the memory array 240. It must be noted that a plurality of shielding areas in FIG. 5 are in a "don't care" state.

Figure 6:
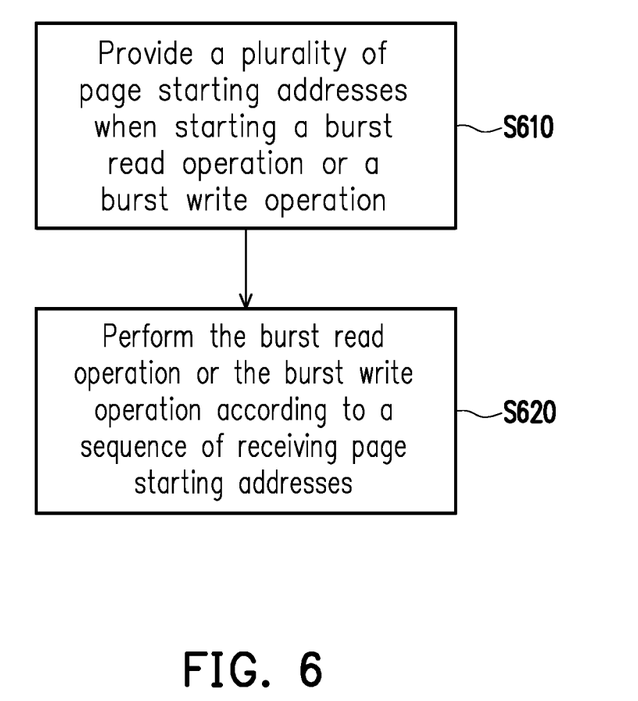
FIG. 6 is a flowchart of a burst read and burst write method according to an embodiment of the disclosure.

With reference to FIG. 6, in step S610, when the memory apparatus starts the burst read operation or the burst write operation, the controller provides a plurality of page starting addresses to the pseudo static random access memory. Then, in step S620, the pseudo static random access memory performs the burst read operation or the burst write operation according to a sequence of receiving the page starting addresses.

In summary, in the memory apparatus and the burst read and burst write method thereof provided in one or more embodiments of the disclosure, when the burst read operation or the burst write operation is started, a plurality of the page starting addresses are provided to the pseudo static random access memory, and the pseudo static random access memory may access a plurality of the page starting addresses in a burst read command cycle or a burst write command cycle, so as to improve the burst access efficiency and thereby improve data transmission efficiency, access throughput, and system performance.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A memory apparatus, comprising:
   a pseudo static random access memory; and
   a controller, coupled to the pseudo static random access memory,
   wherein when the memory apparatus starts a burst read operation or a burst write operation, the controller provides a plurality of page starting addresses to the pseudo static random access memory, and the pseudo static random access memory performs the burst read operation or the burst write operation according to a sequence of receiving the page starting addresses.

2. The memory apparatus according to claim 1, wherein the controller is further configured to provide an external command to the pseudo static random access memory, wherein the external command comprises a command address, wherein when the memory apparatus starts the burst read operation or the burst write operation, it is determined whether to perform the burst read operation or the burst write operation in a memory array of the pseudo static random access memory according to a value of an address space bit and a value of a page access bit in the command address.

3. The memory apparatus according to claim 2, wherein when it is determined that the burst read operation or the burst write operation is an access to the memory array according to the value of the address space bit in the command address, and when it is determined that the access to the memory array is a page access according to the value of the page access bit in the command address, the pseudo static random access memory performs the burst read operation or the burst write operation according to the sequence of receiving the page starting addresses.

4. The memory apparatus according to claim 2, wherein
when it is determined that the burst read operation or the burst write operation is a register access according to the value of the address space bit in the command address, the pseudo static random access memory performs the register access,
when it is determined that the burst read operation or the burst write operation is an access to the memory array according to the value of the address space bit in the command address, the pseudo static random access memory determines whether the access to the memory array is a page access according to the page access bit in the command address,
when it is determined that the access to the memory array is the page access according to the value of the page access bit in the command address, the pseudo static random access memory sequentially performs the page access according to the page starting addresses, and
after the page access is sequentially performed according to all of the page starting addresses, the pseudo static random access memory performs the access to the memory array.

5. The memory apparatus according to claim 1, wherein the pseudo static random access memory comprises:
an input/output circuit, coupled to the controller and configured to receive an external command and an external address from the controller;
a command decoder, coupled to the input/output circuit and configured to receive the external command from the input/output circuit and decode the external command to provide and external read-write signal and a burst read-write signal;
an address latch decoding circuit, coupled to the input/output circuit and the command decoder and configured to receive the external address from the input/output circuit and receive the external read-write signal and the burst read-write signal from the command decoder, sequentially latch the page starting addresses in the external address according to the external read-write signal and the burst read-write signal to output a burst address to a memory array, and sequentially perform the burst read operation or the burst write operation on the memory array according to the burst address; and the memory array, coupled to the command decoder and the address latch decoding circuit and configured to receive the burst address to sequentially perform the burst read operation or the burst write according to the burst address.

6. The memory apparatus according to claim 5, wherein the address latch decoding circuit comprises:
a plurality of input indicators coupled in series and configured to receive the external read-write signal from the command decoder;
a plurality of latches, respectively coupled to the input indicators and configured to receive the external address from the input/output circuit, wherein the external address comprises the page starting addresses; and
a plurality of output indicators coupled in series, respectively coupled to the latches, and configured to receive the burst read-write signal from the command decoder,
wherein the input indicators are configured to generate a plurality of latch input control signals for sequentially latching the page starting addresses in the external address to the latches according to the external read-write signal, and the output indicators are configured to generate a plurality of latch output control signals for enabling the latches to sequentially output the latched page starting addresses in the external address as the burst address according to the burst read-write signal.

7. The memory apparatus according to claim 6, wherein the latches are configured to latch the external address to output the burst address according to the latch input control signals and the latch output control signals, and the burst address is configured to sequentially and continuously provide the page starting addresses in the external address to the memory array.

8. A burst read and burst write method, adapted to a memory apparatus comprising a pseudo static random access memory and a controller, the burst read and burst write method comprising:
providing a plurality of page starting addresses when starting a burst read operation or a burst write operation, and performing the burst read operation or the burst write operation according to a sequence of receiving the page starting addresses.

9. The burst read and burst write method according to claim 8, wherein the controller is further configured to provide an external command to the pseudo static random access memory, and the external command comprises a command address,
wherein when the burst read operation or the burst write operation is started, it is determined whether to perform the burst read operation or the burst write operation in a memory array of the pseudo static random access memory according to a value of an address space bit and a value of a page access bit in the command address.

10. The burst read and burst write method according to claim 9, wherein when it is determined that the burst read operation or the burst write operation is an access to the memory array according to the value of the address space bit in the command address, and when it is determined that the access to the memory array is a page access according to the value of the page access bit in the command address, the burst read operation or the burst write operation is performed according to the sequence of receiving the page starting addresses.

11. The burst read and burst write method according to claim 9, when it is determined that the burst read operation or the burst write operation is a register access according to the value of the address space bit in the command address, performing the register access;

when it is determined that the burst read operation or the burst write operation is an access to the memory array according to the value of the address space bit in the command address, determining whether the access to the memory array is a page access according to the page access bit in the command address;

when it is determined that the access to the memory array is the page access according to the value of the page access bit in the command address, receiving the page starting addresses; and after receiving the page starting addresses, performing the access to the memory array.

12. The burst read and burst write method according to claim 8, wherein the pseudo static random access memory comprises an input/output circuit, a command decoder, an address latch decoding circuit, and a memory array, wherein the input/output circuit is configured to receive an external command and an external address from the controller;

the command decoder is configured to receive the external command from the input/output circuit, so as to decode the external command to provide an external read-write signal and a burst read-write signal;

the address latch decoding circuit is configured to receive the external address from the input/output circuit and receive the external read-write signal and the burst read-write signal from the command decoder, sequentially latch the page starting addresses in the external address according to the external read-write signal and the burst read-write signal to output a burst address to a memory array, and sequentially perform the burst read operation or the burst write operation to the memory array according to the burst address; and the memory array is configured to receive the burst address to sequentially perform the burst read operation or the burst write according to the burst address.

13. The burst read and burst write method according to claim 12, wherein the address latch decoding circuit comprises a plurality of input indicators coupled in series, a plurality of latches, and a plurality of output indicators coupled in series, wherein the input indicators are configured to receive the external read-write signal from the command decoder, the latches are configured to receive the external address from the input/output circuit, the output indicators are configured to receive the burst read-write signal from the command decoder, the input indicators are configured to generate a plurality of latch input control signals for latching a plurality of addresses in the external address to the latches according to the external read-write signal, and the output indicators are configured to generate a plurality of latch output control signals for enabling the latches to sequentially output a plurality of the latched addresses in the external address as the burst address according to the burst read-write signal.

14. The burst read and burst write method according to claim 13, wherein the latches are configured to latch the external address to output the burst address according to the latch input control signals and the latch output control signals, and the burst address is configured to sequentially and continuously provide the addresses in the external address.

* * * * *